US008841959B2

(12) United States Patent
Kim et al.

(10) Patent No.: US 8,841,959 B2
(45) Date of Patent: Sep. 23, 2014

(54) CIRCUIT AND METHOD FOR REMOVING NOISE

(71) Applicant: HiDeep Inc., Seongnam-si (KR)

(72) Inventors: Seyeob Kim, Gyeonggi-do (KR);
Youngho Cho, Gyeonggi-do (KR);
Bonkee Kim, Seoul (KR)

(73) Assignee: HiDeep Inc., Seongnam-si, Gyeonggi-do (KR)

( * ) Notice: Subject to any disclaimer, the term of this patent is extended or adjusted under 35 U.S.C. 154(b) by 0 days.

(21) Appl. No.: 13/797,079

(22) Filed: Mar. 12, 2013

(65) Prior Publication Data

US 2013/0257526 A1     Oct. 3, 2013

(30) Foreign Application Priority Data

Mar. 29, 2012   (KR) .................. 10-2012-0032237

(51) Int. Cl.
*H03K 3/012* (2006.01)
*G05F 1/563* (2006.01)
*H03K 3/013* (2006.01)
*H02M 3/07* (2006.01)
*H02M 1/00* (2006.01)

(52) U.S. Cl.
CPC ............... *H03K 3/013* (2013.01); *G05F 1/563* (2013.01); *H02M 3/07* (2013.01); *H02M 2001/0045* (2013.01); *H03K 3/012* (2013.01)
USPC ..................... 327/538; 327/589; 327/534

(58) Field of Classification Search
USPC ......................... 327/534–544, 589
See application file for complete search history.

(56) References Cited

U.S. PATENT DOCUMENTS

| 6,937,487 B1 * | 8/2005 | Bron ............................... 363/60 |
| 7,084,612 B2 * | 8/2006 | Zinn ............................... 323/266 |
| 7,764,113 B2 * | 7/2010 | Ryu et al. ...................... 327/541 |

FOREIGN PATENT DOCUMENTS

KR     10-1017297     2/2011

OTHER PUBLICATIONS

Korean Office Action issued in related Korean Patent Application No. 10-2012-0032237, dated Oct. 29, 2012.

* cited by examiner

*Primary Examiner* — Dinh Le
(74) *Attorney, Agent, or Firm* — Foley & Lardner LLP

(57) ABSTRACT

Disclosed is a noise removing circuit including: a voltage booster which boosts an input signal; and a regulator which receives an output signal of the voltage booster and reduces the signal's voltage higher than a specific value to the signal's voltage having the specific value and then outputs the signal.

4 Claims, 2 Drawing Sheets

CIRCUIT AND METHOD FOR REMOVING NOISE

BACKGROUND

1. Field

The present invention relates to a circuit and a method for removing noise, and more particularly to a circuit and a method for minimizing power consumption and for removing voltage loss during the removal of noise.

2. Description of Related Art

Generally, it is very important to stably supply power voltage to a chip including a circuit comprised of memories, latches, flipflops, registers or the like. However, since noise may be included in the power voltage by a variety of factors, various solutions to the removal of the noise have been proposed. A regulator is generally used to remove the noise. The regulator generally rectifies the voltage of an input signal into a voltage lower than the voltage of the input signal in order to output the voltage of the input signal without noise.

Therefore, it is necessary to develop a technology for removing the noise without voltage loss of the input signal.

SUMMARY

One embodiment is a noise removing circuit including: a voltage booster which boosts an input signal; and a regulator which receives an output signal of the voltage booster and reduces the signal's voltage higher than a specific value to the signal's voltage having the specific value and then outputs the signal.

Noise is included in the input signal or in a ground. When it is assumed that the specific voltage is $V_{OUT}$, a magnitude of the output signal of the voltage booster is $V_{CP}$ and a peak-to-peak voltage of the noise is $V_{NPP}$, it is desirable that a relationship of $$V_{CP} - \frac{V_{NPP}}{2} \geq V_{OUT}$$

should be satisfied.

The specific voltage may be equal to a magnitude of the input signal.

The voltage booster may be a charge pump. The regulator may be a low dropout (LDO) regulator.

The noise removing circuit may further include a controller which detects the noise existing in the input signal or in the ground, detects the peak-to-peak voltage of the noise, and then transfer information about a degree of the signal boosting to the voltage booster. The voltage booster may boost the signal in accordance with the information from the controller such that a relationship of $$V_{CP} - \frac{V_{NPP}}{2} = V_{OUT}$$

is satisfied.

Another embodiment is a method for removing noise. The method includes boosting an input signal; and receiving the boosted signal, reducing the signal's voltage higher than a specific voltage to the specific voltage, and then outputting the signal.

Noise is included in the input signal or in a ground. When it is assumed that the specific voltage is $V_{OUT}$, a magnitude of the output signal of the voltage booster is $V_{CP}$ and a peak-to-peak voltage of the noise is $V_{NPP}$, it is desirable that the boosting the signal outputs a signal satisfying a relationship of $$V_{CP} - \frac{V_{NPP}}{2} \geq V_{OUT}$$

should be satisfied.

The specific voltage may be equal to a magnitude of the input signal.

Prior to the boosting the signal, the method may further include detecting the noise existing in the input signal or in the ground, detecting the peak-to-peak voltage of the noise, and determining a degree of the signal boosting. The signal is boosted in accordance with the determined degree of the signal boosting such that a relationship of $$V_{CP} - \frac{V_{NPP}}{2} = V_{OUT}$$

is satisfied.

DETAILED DESCRIPTION

Figure 1:
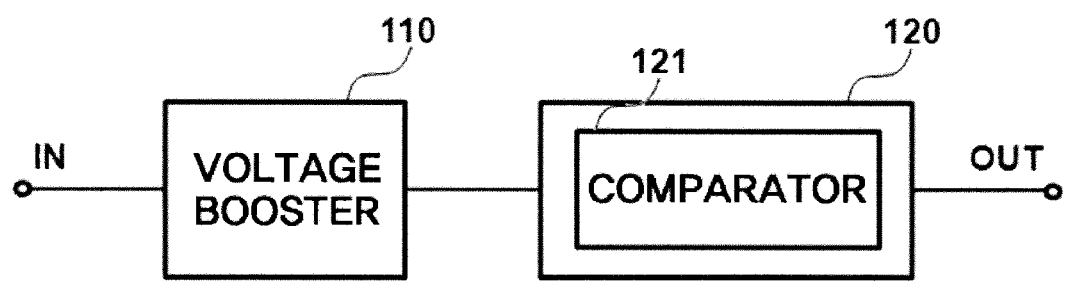
FIG. 1 is a view showing a configuration of a noise removing circuit according to an embodiment of the present invention.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

Hereafter, exemplary embodiments of the present invention will be described in detail with reference to the accompanying drawings in order that the present invention may be easily implemented by those skilled in the art.

An Embodiment of the Present Invention

Configuration of a Noise Removing Circuit

FIG. 1 is a view showing a configuration of a noise removing circuit according to an embodiment of the present invention.

Referring to FIG. 1, the noise removing circuit according to the embodiment includes a voltage booster 110 and a regulator 120.

The voltage booster 110 functions to boost a voltage of a signal inputted from an input terminal. While it is recommended that the voltage booster 110 should be implemented by a charge pump (CP), the voltage booster 110 may be implemented by another DC-DC converter and the like. The input signal may include noise. Here, the voltage of the input signal is boosted, so that the minimum value of the input signal including the noise can be increased. As will be described below, the voltage booster 110 boosts the voltage of the input signal including the noise, thereby causing the noise to be efficiently removed by the regulator 120 subsequently connected to the voltage booster 110. Since it is enough as long as the voltage booster 110 is implemented by a conventional circuit capable of boosting an input voltage, a detailed description of the implementation of the voltage booster 110 will be omitted.

The regulator 120 outputs a predetermined voltage having a rectified waveform. The regulator 120 may be implemented by a low dropout (LDO) regulator or by another common regulator. The regulator 120 outputs a rectified voltage having a predetermined value. When it is assumed that the predetermined value is, for example, $V_{OUT}$, the regulator 120 reduces an input voltage higher than $V_{OUT}$ to the $V_{OUT}$ and then outputs the input voltage, and also outputs an input voltage lower than $V_{OUT}$ without change. The regulator 120 reduces the voltage of the signal boosted by the voltage booster 110 to a voltage of a certain value, and then outputs the signal. By doing this, the signal without noise can be outputted.

The regulator 120 may include a comparator 121. The comparator 121 receives a reference voltage and a voltage of a node which determines the output voltage. The comparator 121 controls such that the reference voltage and the output voltage are the same as each other.

Figure 2:
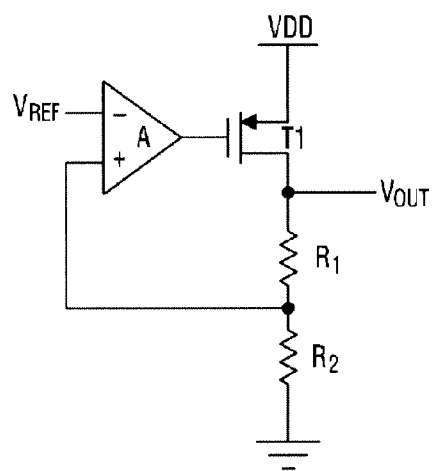
FIG. 2 is a view showing an implementation example of a regulator according to the embodiment of the present invention.

Specifically, referring to FIG. 2 showing an implementation example of the regulator 120, the reference voltage $V_{REF}$ is inputted to an inverting input terminal of an amplifier "A" constituting the comparator 121. The amplifier "A" controls a transistor "T1" such that a voltage of the inverting input terminal is equal to that of a non-inverting input terminal of the amplifier "A". Through this control, the output voltage $V_{OUT}$ can be represented by the following equation (1). That is, the output voltage $V_{OUT}$ is proportional to the reference voltage $V_{REF}$.

$$V_{OUT} = V_{REF} \cdot \left(1 + \frac{R_1}{R_2}\right) \qquad \text{equation (1)}$$

If a deviation occurs in the reference voltage $V_{REF}$ due to noise occurrence at a ground voltage, the same deviation also occurs in the output voltage $V_{OUT}$. Consequently, the output voltage $V_{OUT}$ which is defined by a relationship with the ground voltage becomes constant.

FIG. 2 just shows an implementation example of the regulator 120. The regulator 120 of the present invention may be implemented in a different configuration from this. In other words, regarding the input signal, any circuit capable of reducing the signal's voltage higher than a specific value to the signal's voltage having the specific value and capable of outputting the signal can be used as the regulator 120 of the present invention.

Hereafter, detailed operation examples of the noise removing circuit according to the embodiment of the present invention will be described.

Operation Example of the Noise Removing Circuit

Figure 3:
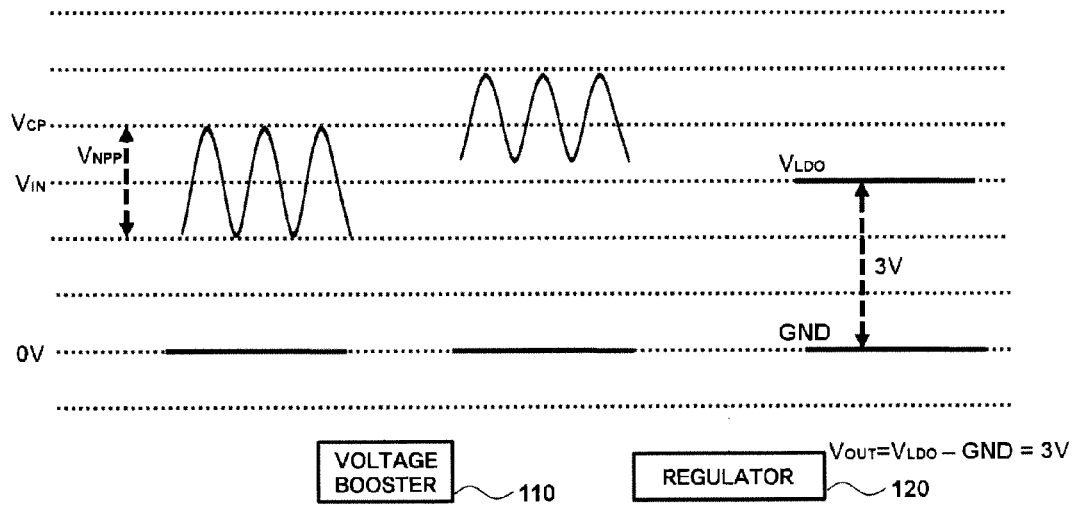
FIGS. 3 and 4 are views for describing operations of the noise removing circuit according to the embodiment of the present invention.

FIG. 3 is a view for describing operations of the noise removing circuit according to the embodiment of the present invention.

Referring to FIG. 3, the operations of the noise removing circuit will be described by assuming that a noise voltage is inputted as an input voltage $V_{IN}$ and finally a voltage of 3V without noise is obtained.

The input voltage is oscillated on the basis of $V_{IN}$ approximately as much as $$\pm \frac{V_{NPP}}{2}$$

due to the noise having a predetermined peak-to-peak voltage $V_{NPP}$.

The input voltage is inputted to the voltage booster 110. As described above, the voltage booster 110 boosts the voltage of the input signal. The regulator 120 receiving the output signal of the voltage booster 110 reduces a high voltage of the signal to a specific value voltage of the signal and then outputs the signal. Therefore, when the voltage booster 110 boosts as much input voltage as possible, this is advantageous to the noise removal. However, the more the voltage booster 110 boosts the voltage, the more the power consumption of the voltage booster 110 is increased. Accordingly, it is necessary to boost the voltage in such a manner as not only to minimize the power consumption but also completely remove the noise. For example, when it is assumed that the magnitude of the input voltage of the noise removing circuit is $V_{IN}$, the magnitude of the output voltage of the noise removing circuit is $V_{OUT}$, the output voltage of the voltage booster 110 is $V_{CP}$, and the peak-to-peak voltage of the noise is $V_{NPP}$, $$V_{CP} - \frac{V_{NPP}}{2} \geq V_{OUT}$$

must be satisfied. Here, since the power consumption of the voltage booster 110 is increased with the increase of the value of $V_{CP}$, it is recommended that the $V_{CP}$ should be $$V_{OUT} + \frac{V_{NPP}}{2}.$$

That is, it is desirable that the width of the voltage boosting of the voltage booster 110 should satisfy $$V_{CP} - V_{IN} = V_{OUT} - V_{IN} + \frac{V_{NPP}}{2}.$$

For the purpose of determining the width of the voltage boosting, i.e., a degree of the voltage boosting, it is necessary that the noise should be detected and the peak-to-peak voltage value should be detected. For this, a controller (not shown) may be further included, which detects the noise and the peak-to-peak voltage value, and thus transfers control information on the degree of the voltage boosting to the voltage booster 110. Through this control, the voltage booster 110 is able to output a signal such that $$V_{CP} - \frac{V_{NPP}}{2} = V_{OUT}$$

is satisfied.

The regulator 120 receives the output voltage of the voltage booster 110 and reduces the signal's voltage higher than a specific value to the signal's voltage having the specific value and then outputs the signal. For example, as shown in FIG. 3, when it is assumed that a noise having the predetermined peak-to-peak voltage $V_{NPP}$ is included in the input voltage VIN of the noise removing circuit and this signal passes through the voltage booster 110 and is boosted to have a magnitude of $$V_{CP} = V_{IN} + \frac{V_{NPP}}{2},$$

an entire interval of the output signal of the voltage booster 110 becomes to have a magnitude greater than $$V_{CP} - \frac{V_{NPP}}{2}.$$

When this signal is inputted to the regulator 120 which reduces all of the voltages' magnitudes greater than $V_{OUT}$ to all of the voltages' magnitudes equal to a specific value and outputs the signal, the signal is having voltage of $V_{OUT}$ is outputted with respect to an interval in which the voltage of the signal is higher than $V_{OUT}$. Here, if a relationship of $$V_{CP} - \frac{V_{NPP}}{2} \geq V_{OUT}$$

is established, $V_{OUT}$ may have a rectified voltage waveform having a specific magnitude.

Although the input signal includes the noise, the input signal is boosted by the voltage booster 110. Therefore, the minimum value of the corresponding boosted signal may be greater than that of the input signal. As the boosted signal passes through the regulator 120, a signal rectified to have a voltage equal to or less than that of the input signal may be obtained. Accordingly, a signal which is the same as the input signal and has no noise, in other words, a signal having a rectified waveform without loss can be obtained.

Figure 4:
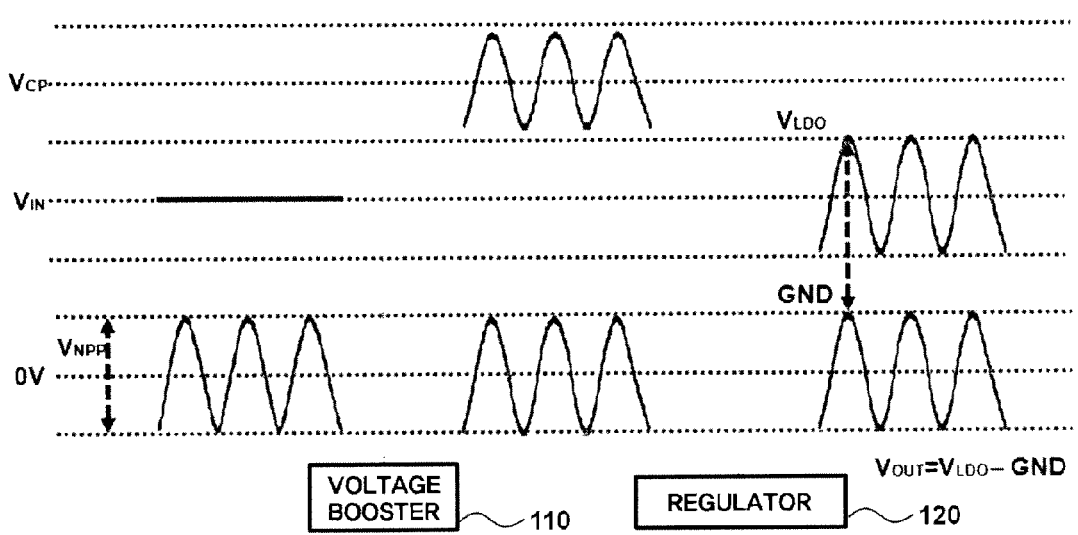

FIG. 4 is a view for describing operations of the noise removing circuit when the input signal of the noise removing circuit has no noise and noise is included in the ground. Referring to FIG. 4, the following description will be provided by assuming that a voltage without noise is inputted as the input signal $V_{IN}$ to the noise removing circuit, a noise having the predetermined peak-to-peak voltage $V_{NPP}$ exists in the ground, and finally, the output voltage $V_{OUT}$ without the noise is obtained. Here, a desired magnitude of the output voltage $V_{OUT}$ may be the same as that of the input signal $V_{IN}$.

As the noise having the predetermined peak-to-peak voltage $V_{NPP}$ occurs in the ground, the ground voltage changes within a range of $$-\frac{V_{NPP}}{2} \sim +\frac{V_{NPP}}{2}.$$

This input voltage is inputted to the voltage booster 110. The width of the boosting of the voltage booster 110 may be determined to be the same as that of the voltage booster 110 of a case where the noise is included in the input signal itself. That is, as described above, the magnitude of the output signal of the voltage booster 110 may be $$V_{CP} \geq V_{IN} + \frac{V_{NPP}}{2}.$$

However, as described above, for the purpose of minimizing the power consumption of the voltage booster 110, it is more desirable that the magnitude of the output signal of the voltage booster 110 should be $$V_{CP} = V_{IN} + \frac{V_{NPP}}{2}.$$

As mentioned above, for the purpose of determining the width of the voltage boosting, i.e., a degree of the voltage boosting, it is necessary that the noise should be detected and the peak-to-peak voltage value should be detected. For this, a controller (not shown) may be further included, which detects the noise and the peak-to-peak voltage value, and thus transfers control information on the degree of the voltage boosting to the voltage booster 110. Through this control, the voltage booster 110 is able to output a signal such that $$V_{CP} - \frac{V_{NPP}}{2} = V_{OUT}$$

is satisfied.

Referring to FIG. 4, under the condition that the noise exists in the ground, the output signal of the voltage booster 110 also includes the corresponding noise and is outputted. The minimum value of the output signal of the voltage booster 110 may be $$V_{CP} - \frac{V_{NPP}}{2}$$

or greater than $$V_{CP} - \frac{V_{NPP}}{2}$$

by the noise.

This signal is inputted to the regulator 120. As described with reference to FIG. 2, the output signal $V_{LDO}$ of the regulator 120 is proportional to the reference voltage $V_{REF}$. Meanwhile, as can be seen referring to FIG. 2, the reference voltage $V_{REF}$ of the regulator 120 is proportional to the ground voltage. Accordingly, the output signal $V_{LDO}$ of the regulator 120 consequently becomes a rectified signal having a specific voltage with respect to the ground. If the noise is included in the ground, the output signal $V_{LDO}$ for the ground also comes to include the corresponding signal as it is. As a result, the signal shown to a user, i.e., the output signal $V_{OUT}$ of the noise removing circuit is $V_{LDO}-V_{GND}$. The regulator 120 functions to reduce all of the voltages higher than $V_{OUT}$ ($=V_{LDO}-V_{GND}$) to voltages equal to $V_{OUT}$ ($=V_{LDO}-V_{GND}$) and then to output the signal. A difference between the minimum voltage value $$\left(V_{CP}-\frac{V_{NPP}}{2}\right)$$

of the output signals of the voltage booster 110 and the minimum voltage value $$\left(-\frac{V_{NPP}}{2}\right)$$

of the ground voltage is equal to or greater than $V_{OUT}$ ($=V_{LDO}-V_{GND}$). Therefore, the final output voltage $V_{OUT}$ of the noise removing circuit comes to have a rectified waveform without the noise. Accordingly, even when the noise exists in the ground, the voltage of the input signal is sufficiently boosted first in such a manner that the regulator 120 completely removes the noise, so that it is possible to obtain a rectified waveform at a voltage which is equal to or lower than that of the input signal.

The features, structures and effects and the like described in the embodiments are included in at least one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A noise removing circuit comprising:
   a charge pump which receives a peak-to-peak voltage value, $V_{NPP}$, and boosts an input signal; and
   a low dropout (LDO) regulator which receives an output signal of the charge pump and reduces a voltage level, $V_{CP}$, of the output signal of the charge pump to a specific voltage, $V_{OUT}$, when $V_{CP}$ is higher than $V_{OUT}$, and then outputs the signal,
   wherein noise is included in the input signal or in a ground,
   and wherein the charge pump boosts the input signal so that the voltage level, $V_{CP}$, of the output signal of the charge pump is approximately equal to $V_{OUT}+(V_{Npp}/2)$.

2. The noise removing circuit of claim 1, wherein $V_{OUT}$ is equal to a magnitude of the input signal.

3. A method for removing noise, the method comprising:
   receiving a peak-to-peak voltage value, $V_{NPP}$;
   boosting an input signal; and
   receiving the boosted signal, reducing a voltage level, $V_{CP}$, of the boosted signal to a specific voltage, $V_{OUT}$, when $V_{CP}$ is higher than $V_{OUT}$, and then outputting the signal,
   wherein noise is included in the input signal or in a ground,
   and wherein the boosting the input signal is performed so that the voltage level, $V_{CP}$, of the boosted signal is approximately equal to $V_{OUT}+(V_{NPP}/2)$.

4. The method of claim 3, wherein $V_{OUT}$ is equal to a magnitude of the input signal.

* * * * *